United States Patent
Burgess et al.

(10) Patent No.: US 7,097,713 B2
(45) Date of Patent: Aug. 29, 2006

(54) METHOD FOR REMOVING A COMPOSITE COATING CONTAINING TANTALUM DEPOSITION AND ARC SPRAYED ALUMINUM FROM CERAMIC SUBSTRATES

(75) Inventors: Ronald Reginald Burgess, Hillsboro, OR (US); Ian Martin Davis, Chandler, AZ (US)

(73) Assignee: The Boc Group, Inc., Murray Hill, NJ (US)

( * ) Notice: Subject to any disclaimer, the term of this patent is extended or adjusted under 35 U.S.C. 154(b) by 179 days.

(21) Appl. No.: 10/643,409

(22) Filed: Aug. 19, 2003

(65) Prior Publication Data

US 2005/0039774 A1 Feb. 24, 2005

(51) Int. Cl.
*B08B 3/04* (2006.01)
*B08B 3/08* (2006.01)
*B08B 3/10* (2006.01)

(52) U.S. Cl. .................. 134/2; 134/3; 134/19; 134/26; 134/28; 134/41; 134/902

(58) Field of Classification Search .............. 134/3, 134/19, 26, 41, 902, 2, 28
See application file for complete search history.

(56) References Cited

U.S. PATENT DOCUMENTS

| | | | |
|---|---|---|---|
| 4,971,631 A | 11/1990 | Sallee et al. .................. 134/3 |
| 5,660,640 A | 8/1997 | Laube ............................ 134/1 |
| 6,296,716 B1 | 10/2001 | Haerle et al. ................... 134/7 |
| 6,494,960 B1 | 12/2002 | Macdonald et al. ........... 134/3 |
| 6,530,388 B1 | 3/2003 | Zuck et al. ............... 134/102.2 |
| 6,810,887 B1 * | 11/2004 | Tan ............................. 134/1.3 |
| 2002/0157687 A1 | 10/2002 | Wang et al. .................... 134/3 |
| 2002/0168867 A1 | 11/2002 | Haerle et al. ................ 438/758 |
| 2003/0116276 A1 | 6/2003 | Weldon et al. |
| 2003/0118731 A1 | 6/2003 | He et al. |
| 2004/0099285 A1 | 5/2004 | Wang et al. |

OTHER PUBLICATIONS

European Search Report for Application No. EP 04 25 4708; Date of completion of the search: Nov. 12, 2004.

* cited by examiner

*Primary Examiner*—Zeinab El-Arini
(74) *Attorney, Agent, or Firm*—Ira Lee Zebrak; Mary K. Nicholes

(57) ABSTRACT

A method for removing a metallic layer from the surface of a ceramic substrate, the method including the steps of immersing the metallic coated ceramic substrate in a solution of up to 31% hydrochloric acid for a sufficient time to at least substantially dissolve or remove the metallic layer therefrom, removing the ceramic substrate from the acid solution, rinsing the ceramic substrate in a rinse solution, and annealing the ceramic substrate at a predetermined temperature for a sufficient time to at least reduce damage or defects in the surface of the ceramic substrate.

30 Claims, 1 Drawing Sheet

METHOD FOR REMOVING A COMPOSITE COATING CONTAINING TANTALUM DEPOSITION AND ARC SPRAYED ALUMINUM FROM CERAMIC SUBSTRATES

FIELD OF THE INVENTION

The present invention is related generally to methods of removing coatings from ceramic substrates, and more particularly to a method for removing a composite coating containing layers of tantalum and aluminum from the surface of ceramic substrates without adversely affecting the underlying ceramic substrate.

BACKGROUND OF THE INVENTION

The fabrication of semiconductor devices requires extensive chemical processing of the surface and body of a silicon wafer. Such processing typically involves chemical reactions such as, for example, diffusion, oxidation and deposition. For processes involving deposition, dielectric materials such as polycrystalline silicon, silicon nitride and silicon dioxide are deposited through suitable chemical means on the surface of the wafer. In deposition applications, species from a source such as a target, a gas inlet manifold and the like may deposit on exposed internal chamber surfaces, including the chamber walls and hardware. Deposition rings are designed to intercept such stray species. Over an extended use, the deposition ring degrades and must be regularly replaced to ensure optimal performance of the deposition equipment.

The deposition ring is generally composed of a ceramic substrate coated with a metallic layer. The metallic layer provides a surface on which the stray species may be readily deposited. The metallic layer is generally composed of a metal that has limited reactivity with the ceramic substrate, resists corrosion and adheres well to the substrate and is economically competitive. Aluminum is the metal that closely matches these requirements. The aluminum layer is generally arc sprayed onto the ceramic substrate and enhances the adhesion of tantalum deposition, for example, or other depositions, thereby improving the performance of the deposition ring. The metal-based top layer is generally composed of tantalum as a deposition species that is deposited through vacuum deposition during use of the deposition ring in semiconductor manufacturing.

Sustained exposure of the ceramic deposition ring to the deposition species, tantalum in this example, will contaminate and degrade the shield to the extent it becomes inoperative. The contaminated and degraded shield must then be replaced with a new one. The spent ceramic shield can be refurbished to reduce maintenance costs of the deposition equipment. Typically, the spent ceramic ring is treated by first removing the metallic layer(s) from the ceramic substrate. The old metallic layer(s) are typically removed by immersing the deposition ring in a heated solution of potassium hydroxide. The potassium hydroxide solution dissolves the aluminum layer, thereby undercutting the tantalum layer. Although the potassium hydroxide solution is useful for removing the old metallic layer(s), it also has a tendency to damage the surface of the ceramic substrate, thereby weakening the bonding of the initial metallic layer to the ceramic substrate resulting in undesirable delamination and flaking.

Accordingly, there is a need to develop a method for removing a metallic layer(s) from the surface of a ceramic substrate without damaging the ceramic substrate to ensure that no delamination of the re-applied metallic layer will occur. There is a further need to develop a method for removing a metallic layer from the surface of a ceramic substrate while enhancing the surface of the ceramic substrate for subsequent re-coating.

SUMMARY OF THE INVENTION

The present invention is directed generally to a method for removing a metallic layer(s) from the surface of a ceramic substrate. The method of the present invention provides an efficient process for removing the metallic layer with little or no damage to the surface of the ceramic substrate. The method further provides in a preferred embodiment the benefit of enhancing and preparing the surface of the ceramic substrate for subsequent application of a new metallic layer(s), thus promoting improved bonding or adhesion therebetween. The method of the present invention relates to the use of a solution containing a strong acid for facilitating the removal of the metallic layer. The inventors discovered that the preferred strong acid is hydrochloric acid (HCl) in that this acid does not induce further significant damage to the ceramic substrate. In the preferred embodiment, the method further relates to heat treating the ceramic substrate to anneal out any imperfections or pre-existing damage that may be present on the surface, and further remove any impurities or contaminants thereon.

The method of the present invention is preferably carried out on ceramic substrates, for example, a deposition ring having a composite layer composed of an aluminum layer on the ceramic substrate. Tantalum metal is typically deposited on the aluminum layer during use of the deposition ring in semiconductor manufacturing. In a preferred embodiment of the invention, the aluminum metal is arc sprayed on the surface of the ceramic substrate.

In one aspect of the present invention, there is provided a method for removing a metallic layer(s) from the surface of a ceramic substrate, in which the method comprises the step of immersing the ceramic substrate coated with the metallic layer(s) formed from at least one metal in a solution of a strong acid for a sufficient time to at least substantially remove the metallic layer therefrom.

In a particular aspect of the present invention, there is provided a method for removing a metallic layer from the surface of a ceramic substrate, in which the method comprises the steps of:
  immersing the ceramic substrate coated with the metallic layer formed from at least one metal in a solution of up to 31% hydrochloric acid for a sufficient time to at least substantially remove the metallic layer therefrom;
  removing the ceramic substrate from the strong acid solution; and
  annealing the ceramic substrate at a predetermined temperature for a time to at least reduce damage or defects in the surface of the ceramic substrate via annealing.

In another aspect of the present invention, there is provided a method for refurbishing a deposition ring comprising a ceramic substrate coated with a metallic composite layer having an aluminum layer in contact with the surface of the ceramic substrate, and a tantalum layer in contact with and overlaying the aluminum layer, in which the method comprises the steps of:
  immersing the ceramic substrate coated with the metallic layer formed from at least one metal in a solution of up to about 31% HCL for a sufficient time to at least substantially remove the metallic layer therefrom;
  removing the ceramic substrate from the strong acid solution;

rinsing the substrate with water;
immersing the substrate in an acid bath of $HNO_3$ and HF;
rinsing the substrate with water; and
drying the ceramic substrate in an oven at a predetermined temperature for a time to dry the substrate.

BRIEF DESCRIPTION OF THE DRAWINGS

Various embodiments of the invention are described in detail below with reference to the drawings, in which like items are identified by the same reference designation, wherein.

DETAILED DESCRIPTION OF THE INVENTION

Figure 1:
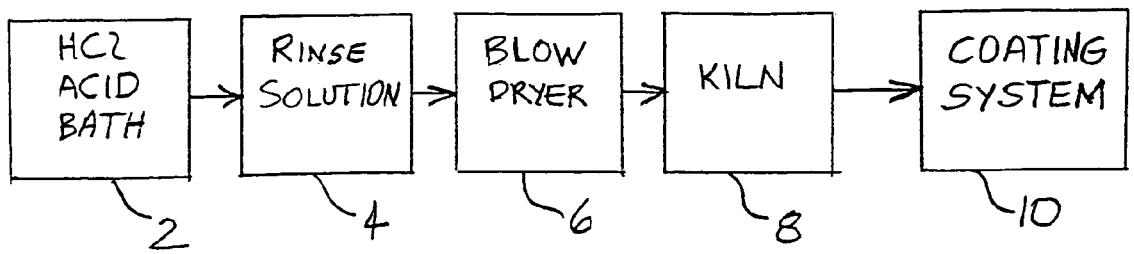
FIG. 1 is a simplified block diagram of a preferred embodiment of the present invention.

The present invention involves a method useful for removing a metal-based composite layer from a ceramic substrate. In a preferred embodiment, the method of the present invention enhances removal of the composite layer, while substantially improving or at least maintaining the surface qualities of the underlying ceramic substrate for subsequent re-application of a new metal-based composite layer. The various embodiments of the present method avoid the damage to surfaces of ceramic substrates typically associated with prior art removal processes. The preferred method of the present invention has further been found to ameliorate pre-existing surface damage or imperfections to the ceramic substrates. The method of the present invention in its embodiments provides a means to efficiently and cost effectively prepare used ceramic substrates, such as those related to the processing of silicon wafers in the fabrication of semiconductor devices, for refurbishment and renewal. In one embodiment, the ceramic substrate forms part of a deposition ring (not shown), but the invention is not so limited, and applicable for removing metal-based composite or individual layers from multiple other parts.

The fabrication of semiconductor devices includes the use of vacuum deposition processes for depositing a coating on a silicon wafer substrate. The deposition process may be physical where a vapor phase is deposited on the desired substrate, or chemical where a vapor phase is passed over the desired substrate and a chemical reaction takes place on the surface. The use of a vapor phase invariably results in the migration of a source material throughout the process chamber of the deposition equipment, requiring the use of deposition rings to reduce the deposition of source material on various components. As a result, the deposition occurs not only on the target substrate, but also on the exposed components such as the deposition rings themselves. Tantalum is a typical source material. Furthermore, the processing typically degrades the surface of the components over time and repeated usage to the extent that the component is no longer operational, thus requiring replacement and refurbishment of the depleted component. New or refurbished deposition rings are provided to the semiconductor fabricator with a layer of aluminum over the ceramic substrate. During use, tantalum is deposited onto the aluminum, and over time reduces the efficacy of associated deposition ring.

In one aspect of the present invention, there is provided a method for removing a metallic layer from the surface of a ceramic substrate, in which the method comprises the step of immersing the ceramic substrate coated with the metallic layer formed from at least one metal in a solution of up to 31% hydrochloric acid (HCl) for a time to at least substantially remove the metallic layer therefrom. In a preferred embodiment, the present method is carried out on a ceramic substrate coated with a composite metallic layer comprising an aluminum layer and a tantalum deposition layer overlaying the aluminum layer.

In another aspect of the present invention, there is provided a method for refurbishing a deposition ring comprising a ceramic substrate coated with a metallic composite layer having an aluminum layer in contact with the surface of the ceramic substrate, and a tantalum deposition layer in contact with and overlaying the aluminum layer, in which the method comprises the steps of:

immersing the ceramic substrate coasted with the metallic composite layer in a solution of up to 31% HCl for a time to at least substantially remove the metallic layer therefrom;

removing the ceramic substrate from the strong acid solution; and coating the ceramic substrate with a new metallic layer.

With reference to FIG. 1, the steps for a preferred embodiment of the invention are generally shown. These steps successively include immersing the metallic coated ceramic substrate in an acid bath 2 of hydrochloric (HCl) for stripping or dissolving the single or composite layer of metallic coating from the substrate, rinsing the substrate in a rinse solution 4, drying the substrate via a blow dryer 6, annealing the substrate in a kiln 8 at an elevated temperature, and recoating the substrate with a desired metal via a coating system 10. In this example, the desired metal is aluminum, but this illustration of the invention using aluminum is not meant to be limiting. Further details of certain of these steps follow below.

Figure 2:
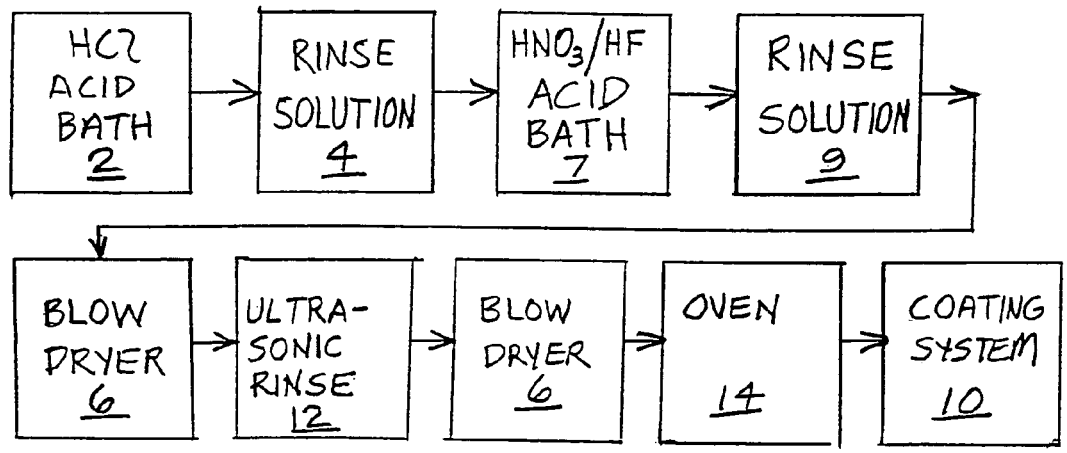
FIG. 2 is a simplified block diagram of anther embodiment of the invention.

In FIG. 2, a second embodiment of the invention is shown, which is less preferred than the embodiment of FIG. 1. In the second embodiment the first embodiment's annealing step using a kiln 8 is absent, necessitating the use of additional steps, as shown. Note that the first two steps, and the last step of the second embodiment are the same as the first two steps and last step of the preferred embodiment of FIG. 1. The successive steps of the second embodiment include immersing the metallic coated ceramic substrate in the HCl acid bath 2, immersing the substrate stripped of the metallic layer in the rinse solution 4, immersing the substrate in an nitric acid and hydrofluoric acid bath 7, drying the substrate with a blow dryer 6, rinsing the substrate in an ultrasonic rinse 12, drying the substrate with a blow dryer 6, baking the substrate in an oven 14, and recoating the substrate with a desired metal via a coating system 10. Further details of certain of these steps follow below.

With further reference to FIG. 1, a simplified block drawing is illustrated to show the basic components and steps in carrying out the preferred method of the present invention. The preferred method of the present invention utilizes a acid bath 2 containing an acid stripping solution formulated for removing or stripping a metallic composite layer via stripping or dissolving the metallic layer(s) away from the surface of the ceramic substrate, while maintaining the surface of the ceramic substrate in a substantially intact state. The acid stripping solution is composed of an aqueous mixture of a strong acid, preferably hydrochloric acid. The preferred acid stripping solution contains up to 31% by volume of hydrochloric acid, and more preferably about 31% by volume of hydrochloric acid. The acid stripping solution is well suited for removing the metallic layer(s), which can be composed of a composite of aluminum and tantalum overlaying ceramic components, for example. The acid stripping solution of the present invention using about 31% HCl has been found to readily remove or strip the metallic layer(s) without causing any appreciable damage to the underlying ceramic substrate.

As previously indicated, one application of the present invention is directed to the refurbishment of depleted or used metallic composite layers on ceramic substrates typically used for deposition ring components in deposition equipment. Typically, the metallic composite layer comprises a layer of tantalum (deposited during use of the deposition ring in semiconductor manufacturing, for example) overlaying a layer of aluminum bonded to the ceramic substrate surface. The depleted deposition ring is initially immersed in an acid bath tank comprising the acid bath 2 containing the acid stripping solution. Preferably, the depleted deposition ring is suspended within the acid bath tank, which can be accomplished through the use of a common hanger hook (not shown), for example. The deposition ring remains immersed for a sufficient time to allow the acid stripping solution to strip or dissolve the metallic layer. The temperature of the acid bath 2 is maintained at about ambient temperature. Normally the deposition ring is immersed in the acid stripping solution or bath 2 for a period ranging from about 15 minutes to about an hour. However, the immersion time is not limited, and can vary depending on the thickness and composition of the metallic composite layer to be removed.

The deposition ring is then removed and rinsed in a rinse solution 4 to remove any acid stripping solution and/or contaminants from the now substantially bare surface of the ceramic substrate. This can be accomplished through immersing the deposition ring in a rinse tank containing a static rinse solution 4. The static rinse solution 4 is water. The deposition ring is immersed in the static rinse solution 4 for a sufficient time to remove the residues, typically, from about thirty seconds to two minutes.

The deposition ring is then removed from the static rinse solution 4 and spray rinsed with deionized water to remove any residues that may be still present on the surface thereof. Once spray rinsed, the deposition ring is thereafter immersed in an overflow rinse tank (not shown). The rinsing of the deposition ring in the rinse solution 4 is repeated as required until the deposition ring no longer contains any residue on its surface that may interfere with subsequent re-coating process to refurbish the component.

In this preferred embodiment of the invention, the deposition ring is heat treated by subjecting it to a controlled temperature ramp in the kiln 8. The kiln 8 can be provided by a conventional commercial kiln. This heat treatment step has been found to remove or eliminate any imperfections or pre-existing damage from the surface of the ceramic substrate through annealing. In addition, the exposure of the deposition ring to the heat treatment oxidizes and drives off organic residues and contaminants from the surface thereof.

In carrying out the annealing step, the deposition ring is heated in the kiln 8 to a temperature of from about 302° F. at a heating ramp rate of about 122° F./hour. The temperature is maintained for about an hour. The deposition ring is thereafter heated to a temperature of about 752° F. at a heating ramp rate of about 212° F./hour. Thereafter, the deposition ring is heated to a temperature of about 1652° F. at a heating ramp rate of about 347° F./hour. The temperature is maintained for about 7 hours. After 7 hours, the deposition ring is allowed to cool to a temperature of about 100° F. at a cooling ramp rate of about minus 210° F./hour.

In the embodiment of FIG. 2, as previously mentioned, an acid rinse step that uses a nitric acid/hydrofluoric acid bath or solution 7 for 5 to 10 minutes to remove stains from the substrate. The inventors discovered that an acid bath 7 containing equal parts (one-third each) of water, HF, and $HNO_3$ removed stains, while minimizing damage to the substrate. However, the use of such solution can damage the substrate, and should be avoided wherever possible particularly when the substrate can be annealed through use of a kiln, or other annealing device, for example.

With further reference to the embodiment of FIG. 2, after immersion in acid bath 7, the deposition ring is immersed in a rinse solution 9 (i.e., static rinse and/or overflow rinse baths) to enhance removal of any residues, contaminants, and the like. The deposition ring or ceramic substrate is then dried via a blow dryer 6, followed by immersion in an ultrasonic rinse 12 using conventional ultrasonic cleaning apparatus. Thereafter, the deposition ring or ceramic substrate is partially dried through the use of a blow dryer 6. The deposition ring is then placed into an oven 14 for about an hour at a temperature of about 250° F. to completely dry the substrate. The oven 14 that is used can be any of those commercially available.

Once the drying in oven 14 or annealing in kiln 8 is completed, the deposition ring or ceramic substrate is prepared for re-coating with a metallic layer in a coating system 10. The coating system 10 can encompass any suitable coating system as known in the art for applying metallic layers or coatings including, but not limited to, twin wire arc spray systems. In one embodiment of the present invention, the deposition ring is initially coated with aluminum through suitable means to yield a coating having the desired thickness, hardness, roughness and bond strength requirements. The aluminum coating may be applied through the use of a thermal spray system including a twin wire arch spray system in particular as widely known in the art. The deposition ring has now been refurbished, and is ready for installation in the host equipment for operation.

Although various embodiments of the invention have been shown and described, they are not meant to be limiting. Those of skill in the art may recognize various modifications to these embodiments, which modifications are meant to be covered by the spirit and scope of the appended claims. For example, the present invention is not limited to use with metallic coated ceramic deposition rings, and can be used for removing metallic coatings from other ceramic based components or parts. Also, other strong acids than HCl can be used, but the inventors have observed that unlike HCl they contribute to the degradation of the ceramic substrate. The inventors also recognize that if lower temperatures and/or lower than about 31% HCl acid concentration is used, the process time may be too long. Also, if higher temperatures and/or higher acid concentrations are used, than up to 31% HCl, the ceramic substrate or component may be damaged.

What is claimed is:

1. A method for removing a metallic layer from a surface of a ceramic substrate comprising the steps of:

immersing the ceramic substrate coated with the metallic layer in an acid solution comprising hydrochloric acid at a concentration of about 31% by volume of the solution for a time to substantially remove the metallic layer therefrom; and annealing the ceramic substrate at a predetermined temperature sufficient to reduce pre-existing damage in the surface of the ceramic substrate by ramping the temperature using a heating ramp rate comprising:

heating to a first temperature of about 302° F. at a first heating ramp rate said ramping the temperature of about 122° F./hour;

maintaining the first temperature for about an hour;

heating to a second temperature of about 752° F. at a second heating ramp rate of about 212° F./hour;

heating to a third temperature of about 1652° F. at a third heating ramp rate of about 347° F./hour;

maintaining the third temperature for about 7 hours; and allowing to cool to a fourth temperature of about 100° F. at a cooling ramp rate of about minus 210° F./hour.

2. A method for removing a metallic layer from a surface of a ceramic substrate comprising the steps of:

immersing the ceramic substrate coated with the metallic layer in an acid solution comprising hydrochloric acid at a concentration of about 31% by volume of the solution for a time to substantially remove the metallic layer therefrom; and annealing the ceramic substrate at a predetermined temperature sufficient to reduce pre-existing damage in the surface of the ceramic substrate by ramping the temperature at a heating ramp rate said ramping the temperature comprising:

heating to a first temperature of about 302° F. at a first heating ramp rate of about 122° F./hour; and maintaining the first temperature for about an hour.

3. The method of claim 2, wherein the ramping step further comprises:

heating to a second temperature of about 752° F. at a second heating ramp rate of about 212° F./hour.

4. The method of claim 3, wherein the ramping step further comprises:

heating to a third temperature of about 1652° F. at a third heating ramp rate of about 347° F./hour; and maintaining the third temperature for about 7 hours.

5. The method of claim 4, wherein the ramping step further comprises:

allowing to cool to a fourth temperature of about 100° F. at a cooling ramp rate of about minus 210° F./hour.

6. A method for removing a metallic layer from a surface of a ceramic substrate comprising the steps of:

immersing the ceramic substrate coated with a metallic layer comprising a composite layer formed from an aluminum coating in contact with the ceramic substrate and a tantalum deposition overlaying the aluminum coating in an acid solution of up to 31% hydrochloric acid by volume for a time to substantially remove the metallic layer therefrom; and annealing the ceramic substrate at an elevated temperature sufficient to reduce pre-existing damage in the surface of the ceramic substrate through annealing by ramping the temperature at a heating ramp rate said ramping the temperature comprising:

heating to a first temperature of from about 302° F. at a first heating ramp rate of about 122° F./hour;

maintaining the first temperature for about an hour;

heating to a second temperature of about 752° F. at a second heating ramp rate of about 212° F./hour;

heating to a third temperature of about 1652° F. at a third heating ramp rate of about 347° F./hour;

maintaining the third temperature for about 7 hours; and allowing to cool to a fourth temperature of about 100° F. at a cooling ramp rate of about minus 210° F./hour.

7. A method for removing a metallic layer from a surface of a ceramic substrate comprising the steps of:

immersing the ceramic substrate coated with a metallic layer comprising a composite layer formed from an aluminum coating in contact with the ceramic substrate and a tantalum deposition overlaying the aluminum coating in an acid solution of up to 31% hydrochloric acid by volume for a time to substantially remove the metallic layer therefrom; and annealing the ceramic substrate at an elevated temperature sufficient to reduce pre-existing damage in the surface of the ceramic through annealing by ramping the temperature at a heating ramp rate said ramping the temperature comprising:

heating to a first temperature of about 302° F. at a first heating ramp rate of about 122° F./hour; and maintaining the first temperature for about an hour.

8. The method of claim 7, wherein the ramping step further comprises:

heating to a second temperature of about 752"F at a second heating ramp of about 212° F./hour.

9. The method of claim 8, wherein the ramping step further comprises:

heating to a third temperature of about 1652° F. at a third heating ramp rate of about 347° F./hour; and maintaining the third temperature for about 7 hours.

10. The method of claim 9, wherein the ramping step farther comprises:

allowing to cool to a fourth temperature of about 100° F. at a cooling ramp rate of about minus 210° F./hour.

11. A method for removing a metallic layer from a surface of a ceramic substrate comprising the steps of:

immersing the ceramic substrate coated with the metallic layer formed from one metal in an acid solution of up to 31% hydrochloric acid by volume for a time to remove a portion of the metallic layer therefrom; and annealing the ceramic substrate subsequent to the immersion step at an elevated temperature sufficient to reduce pre-existing damage in the surface of the substrate by ramping the temperature at a heating ramp rate said ramping the temperature comprising:

heating to a first temperature of about 302° F. at a first heating ramp rate of about 122° F./hour;

maintaining the first temperature for about an hour;

heating to a second temperature of about 752° F. at a second heating ramp rate of about 212° F./hour;

heating to a third temperature of about 1652° F. at a third heating ramp rate of about 347° F./hour;

maintaining the third temperature for about 7 hours; and allowing to cool to a fourth temperature of about 100° F. at a cooling ramp rate of about minus 210° F./hour.

12. A method for removing a metallic layer from a surface of a ceramic substrate comprising the steps of:

immersing the ceramic substrate coated with the metallic layer formed from one metal in an acid solution of up to 31% hydrochloric acid by volume for a time to remove a portion of the metallic layer therefrom; and annealing the ceramic substrate subsequent to the immersion step at an elevated temperature sufficient to reduce pre-existing damage in the surface of the substrate by ramping the temperature at a heating ramp rate said ramping the temperature comprising:

heating to a first temperature of about 302° F. at a first heating ramp rate of about 122° F./hour; and maintaining the first temperature for about an hour.

13. The method of claim 12, wherein the ramping step further comprises:

heating to a second temperature of about 752° F. at a second heating ramp rate of about 212° F./hour.

14. The method of claim 13, wherein the ramping step further comprises:
heating to a third temperature of about 1652° F. at a third heating ramp rate of about 347° F./hour; and
maintaining the third temperature for about 7 hours.

15. The method of claim 14, wherein the ramping step further comprises:
allowing to cool to a fourth temperature of about 100° F. at a cooling ramp rate of about minus 210° F./hour.

16. A method for removing a metallic layer from a surface of a ceramic substrate comprising the steps of:
immersing the ceramic substrate coated with the metallic layer formed from one metal in an acid solution comprising hydrochloric acid at a concentration of up to 31% by volume of the solution for a time to remove a portion of the metallic layer therefrom; and
annealing the ceramic substrate subsequent to the immersion step at an elevated temperature sufficient to reduce pre-existing damage in the surface of the substrate by ramping the temperature at a heating ramp rate said ramping the temperature comprising:
heating to a first temperature of from about 302° F. at a first heating ramp rate of about 122° F./hour;
maintaining the first temperature for about an hour;
heating to a second temperature of about 752° F. at a second heating ramp rate of about 212° F./hour;
heating to a third temperature of about 1652° F. at a third heating ramp rate of about 347° F./hour;
maintaining the third temperature for about 7 hours; and
allowing to cool to a fourth temperature of about 100° F. at a cooling ramp rate of about minus 210° F./hour.

17. A method for removing a metallic layer from a surface of a ceramic substrate comprising the steps of:
immersing the ceramic substrate coated with the metallic layer formed from one metal in an acid solution comprising hydrochloric acid at a concentration of up to 31% by volume of the solution for a time to remove a portion of the metallic layer therefrom; and
annealing the ceramic substrate subsequent to the immersion step at an elevated temperature sufficient to reduce pre-existing damage in the surface of the substrate by ramping the temperature at a heating ramp rate said ramping the temperature comprising:
heating to a first temperature of about 302° F. at a first heating ramp rate of about 122° F./hour; and
maintaining the first temperature for about an hour.

18. The method of claim 17, wherein the ramping step further comprises:
heating to a second temperature of about 752° F. at a second heating ramp rate of about 212° F./hour.

19. The method of claim 18, wherein the ramping step further comprises:
heating to a third temperature of about 1652° F. at a third heating ramp rate of about 347° F./hour; and
maintaining the third temperature for about 7 hours.

20. The method of claim 19, wherein the ramping step further comprises:
allowing to cool to a fourth temperature of about 100° F. at a cooling ramp rate of about minus 210° F./hour.

21. A method for refurbishing a deposition ring comprising a ceramic substrate coated with a metallic composite layer having an aluminum layer in contact with a surface of the ceramic substrate and a tantalum layer deposited over the aluminum layer comprising the steps of:
immersing the ceramic substrate coated with the metallic composite layer in a solution of up to 31% hydrochloric acid by volume for a time to remove a portion of the metallic layer therefrom;
removing the ceramic substrate from the acid solution;
rinsing the ceramic substrate in a rinse solution;
drying the substrate;
annealing the ceramic substrate at a predetermined temperature for a time to reduce damage or defects in the surface of the ceramic substrate by ramping the temperature at a heating ramp rate said ramping the temperature comprising:
heating to a first temperature of about 302° F. at a first heating ramp rate of about 122° F./hour;
maintaining the first temperature for about an hour;
heating to a second temperature of about 752° F. at a second heating ramp rate of about 212° F./hour;
heating to a third temperature of about 1652° F. at a third heating ramp rate of about 347° F./hour;
maintaining the third temperature for about 7 hours; and
allowing to cool to a fourth temperature of about 100° F. at a cooling ramp rate of about minus 210° F./hour; and
coating the ceramic substrate with a new metallic layer.

22. A method for refurbishing a deposition ring comprising a ceramic substrate coated with a metallic composite layer having an aluminum layer in contact with a surface of the ceramic substrate and a tantalum layer deposited over the aluminum layer comprising the steps of:
immersing the ceramic substrate coated with the metallic composite layer in a solution of up to 31% hydrochloric acid by volume for a time to remove a portion of the metallic layer therefrom;
removing the ceramic substrate from the acid solution;
rinsing the ceramic substrate in a rinse solution;
drying the substrate;
annealing the ceramic substrate at a predetermined temperature for a time to reduce damage or defects in the surface of the ceramic substrate by ramping the temperature at a heating ramp rate said ramping the temperature comprising:
heating to a first temperature of about 302° F. at a first heating ramp rate of about 122° F./hour; and
maintaining the first temperature for about an hour; and
coating the ceramic substrate with a new metallic layer.

23. The method of claim 22, wherein the ramping step further comprises:
heating to a second temperature of about 752° F. at a second heating ramp rate of about 212° F./hour.

24. The method of claim 23, wherein the ramping step further comprises:
heating to a third temperature of about 1652° F. at a third heating ramp rate of about 347° F./hour; and
maintaining the third temperature for about 7 hours.

25. The method of claim 24, wherein the ramping step further comprises:
allowing to cool to a fourth temperature of about 100° F. at a cooling ramp rate of about minus 210° F./hour.

26. A method for refurbishing a deposition ring comprising a ceramic substrate coated with a metallic composite layer having an aluminum layer in contact with a surface of the ceramic substrate and a tantalum layer deposited over the aluminum layer comprising the steps of:
immersing the ceramic substrate coated with the metallic composite layer in an acid solution including about 31% hydrochloric acid by volume for a sufficient time to substantially remove the metallic layer therefrom;
removing the ceramic substrate from the acid solution;
rinsing the ceramic substrate in a rinse solution;
drying the substrate;
annealing the ceramic substrate at a predetermined temperature for a time to reduce damage or defects in the surface of the ceramic substrate by ramping the temperature at a heating ramp rate said ramping the temperature comprising:
heating to a first temperature of from about 302° F. at a first heating ramp rate of about 122° F./hour;
maintaining the first temperature for about an hour;
heating to a second temperature of about 752° F. at a second heating ramp rate of about 212° F./hour;
heating to a third temperature of about 1652° F. at a third heating ramp rate of about 347° F./hour;
maintaining the third temperature for about 7 hours; and
allowing to cool to a fourth temperature of about 100° F. at a cooling ramp rate of about minus 210° F./hour; and
coating the ceramic substrate with a new metallic layer.

27. A method for refurbishing a deposition ring comprising a ceramic substrate coated with a metallic composite layer having an aluminum layer in contact with a surface of the ceramic substrate and a tantalum layer deposited over the aluminum layer comprising the steps of:
immersing the ceramic substrate coated with the metallic composite layer in an acid solution including about 31% hydrochloric acid by volume for a sufficient time to substantially remove the metallic layer therefrom;
removing the ceramic substrate from the acid solution;
rinsing the ceramic substrate in a rinse solution;
drying the substrate;
annealing the ceramic substrate at a predetermined temperature for a sufficient time to reduce damage or defects in the surface of the ceramic substrate by ramping the temperature at a heating ramp rate said ramping the temperature comprising:
heating to a first temperature of about 302° F. at a first heating ramp rate of about 122° F./hour; and
maintaining the first temperature for about an hour; and
coating the ceramic substrate with a new metallic layer.

28. The method of claim 27, wherein the ramping step further comprises:
heating to a second temperature of about 752° F. at a second heating ramp rate of about 212° F./hour.

29. The method of claim 28, wherein the ramping step further comprises:
heating to a third temperature of about 1652° F. at a third heating ramp rate of about 347° F./hour; and
maintaining the third temperature for about 7 hours.

30. The method of claim 29, wherein the ramping step further comprises:
allowing to cool to a fourth temperature of about 100° F. at a cooling ramp rate of about minus 210° F./hour.

* * * * *